United States Patent
Yang et al.

(10) Patent No.: US 9,478,698 B2
(45) Date of Patent: Oct. 25, 2016

(54) LIGHT EMITTING DEVICE HAVING A LIGHT EXTRACTION LAYER

(71) Applicant: Epistar Corporation, Hsinchu (TW)

(72) Inventors: Tsung-Hsien Yang, Hsinchu (TW);
Tzu-Chieh Hsu, Hsinchu (TW);
Yi-Ming Chen, Hsinchu (TW);
Yi-Tang Lai, Hsinchu (TW);
Jhih-Jheng Yang, Hsinchu (TW);
Chih-Wei Wei, Hsinchu (TW);
Ching-Sheng Chen, Hsinchu (TW);
Shih-I Chen, Hsinchu (TW);
Chia-Liang Hsu, Hsinchu (TW);
Ye-Ming Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 147 days.

(21) Appl. No.: 14/174,036

(22) Filed: Feb. 6, 2014

(65) Prior Publication Data

US 2014/0225138 A1  Aug. 14, 2014

(30) Foreign Application Priority Data

Feb. 8, 2013 (TW) .............................. 102105537 A
Jan. 21, 2014 (TW) .............................. 103102220 A

(51) Int. Cl.
*H01L 33/02* (2010.01)
*H01L 33/00* (2010.01)

(52) U.S. Cl.
CPC ........... *H01L 33/02* (2013.01); *H01L 33/0079* (2013.01)

(58) Field of Classification Search
CPC .......................... H01L 33/02; H01L 33/0079
See application file for complete search history.

(56) References Cited

U.S. PATENT DOCUMENTS

| | | | |
|---|---|---|---|
| 2004/0253427 A1* | 12/2004 | Yokogawa | C09D 7/1291 428/212 |
| 2007/0241668 A1* | 10/2007 | Ottermann | G02B 1/11 313/504 |
| 2008/0173887 A1* | 7/2008 | Baba | H01L 33/20 257/98 |
| 2009/0110017 A1* | 4/2009 | Aihara | H01L 33/0079 372/44.01 |
| 2012/0229020 A1* | 9/2012 | Yonehara | H01L 51/5072 313/504 |
| 2012/0248479 A1* | 10/2012 | Anc | B82Y 20/00 257/98 |
| 2013/0313518 A1* | 11/2013 | Seo | H01L 33/24 257/13 |
| 2014/0191264 A1* | 7/2014 | Kim | H01L 33/02 257/98 |

* cited by examiner

*Primary Examiner* — Minh-Loan Tran
*Assistant Examiner* — Farid Khan
(74) *Attorney, Agent, or Firm* — Ditthavong & Steiner, P.C.

(57) ABSTRACT

A light-emitting device is disclosed and comprises: a transparent substrate; a semiconductor light-emitting stack on the transparent substrate, wherein the semiconductor light-emitting stack comprises a first semiconductor layer close to the transparent substrate, a second semiconductor layer away from the transparent substrate, and a light-emitting layer capable of emitting a light disposed between the first semiconductor layer and the second semiconductor layer; and a bonding layer between the transparent substrate and the semiconductor light-emitting stack, wherein the bonding layer has a gradually changed refractive index, and each of critical angles at the bonding layer and the transparent substrate for the light emitted from the light-emitting layer towards the transparent substrate is larger than 35 degrees.

14 Claims, 3 Drawing Sheets

LIGHT EMITTING DEVICE HAVING A LIGHT EXTRACTION LAYER

TECHNICAL FIELD

The application relates to a light-emitting device, in particular to a light-emitting device with a bonding layer having a gradually changed refractive index.

REFERENCE TO RELATED APPLICATION

This application claims the right of priority based on Taiwan application Ser. No. 102105537, filed on Feb. 8, 2013, and the right of priority based on Taiwan application Ser. No. 103102220, filed on Jan. 21, 2014, the contents of which are incorporated herein by reference in its entirety.

DESCRIPTION OF BACKGROUND ART

A light-emitting diode (LED) is a solid state semiconductor device. The light-emitting diode comprises a light-emitting structure which comprises a p-type semiconductor layer, an n-type semiconductor layer, and a light-emitting layer disposed between the p-type semiconductor layer and the n-type semiconductor layer. The light-emitting structure comprises compound semiconductors composed of III-V group elements, such as gallium phosphide (GaP), gallium arsenide (GaAs), and gallium nitride (GaN). The theory for the light-emitting diode to emit light is that when an external electrical field is applied, the electrons from the n-type semiconductor and the holes from the p-type semiconductor are combined near a p-n junction of the fight-emitting layer. And electrical energy is converted into light energy.

FIG. 1 is a cross-sectional view of a conventional light-emitting device 1. As shown in FIG. 1, the light-emitting device 1 comprises a transparent substrate 10, a first semiconductor layer 12 on the transparent substrate 10, a second semiconductor layer 16 on the first semiconductor layer 12, and a light-emitting layer 14 disposed between the first semiconductor layer 12 and the second semiconductor layer 16. The material of the first semiconductor layer 12 comprises III-V group semiconductor material, wherein a refractive index thereof is about 3.1~3.5. The material of the transparent substrate 10 comprises sapphire or glass, wherein a refractive index thereof is about 1.5~1.7.

Since the difference of the refractive indexes between the transparent substrate 10 and the first semiconductor layer 12 is large, the critical angle θc between the transparent substrate 10 and the first semiconductor layer 12 is less than 35 degrees. When light emitted by the light-emitting layer 14 travels from the first semiconductor layer 12 to the transparent substrate 10, the incident angle of light must be within 35 degrees for light to exit. Light with an incident angle more than 35 degrees is totally reflected at the interface of the transparent substrate 10 and the first semiconductor layer 12 and is therefore confined to the interior of the light-emitting device 1. The light extraction efficiency of the light-emitting device 1 is reduced.

FIG. 2 is the light intensity distribution of the conventional light-emitting device 1. Since the critical angle θc between the transparent substrate 10 and the first semiconductor layer 12 is less than 35 degrees, only light with the incident angle less than 35 degrees can be extracted from the transparent substrate 10. Accordingly, the far-field angle of light emitted by the conventional light-emitting device 1 with a light intensity of 50% is about 117 degrees.

SUMMARY OF THE DISCLOSURE

A light-emitting device is disclosed and comprises: a transparent substrate; a semiconductor light-emitting stack on the transparent substrate, wherein the semiconductor light-emitting stack comprises a first semiconductor layer close to the transparent substrate, a second semiconductor layer away from the transparent substrate, and a light-emitting layer capable of emitting a light disposed between the first semiconductor layer and the second semiconductor layer; and a bonding layer between the transparent substrate and the semiconductor light-emitting stack, wherein the bonding layer has a gradually changed refractive index, and each of critical angles at the bonding layer and the transparent substrate for the light emitted from the light-emitting layer towards the transparent substrate is larger than 35 degrees.

DETAILED DESCRIPTION OF PREFERRED EMBODIMENTS

Figure 1:
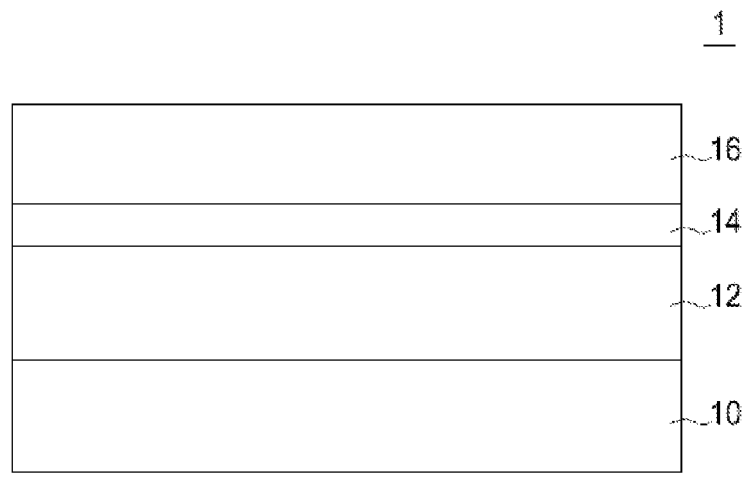
FIG. 1 shows a conventional light-emitting device.
Figure 2:
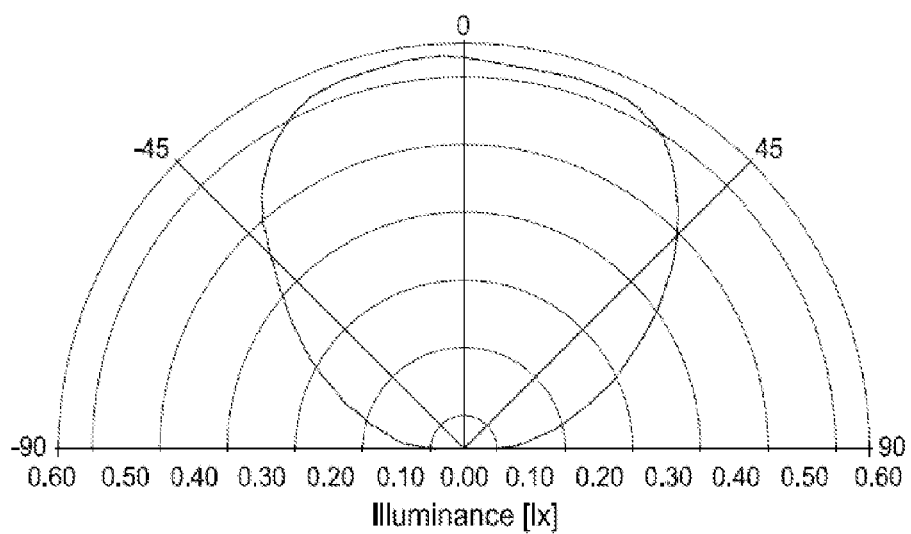
FIG. 2 shows the light intensity distribution of the conventional light-emitting device.
Figure 3:
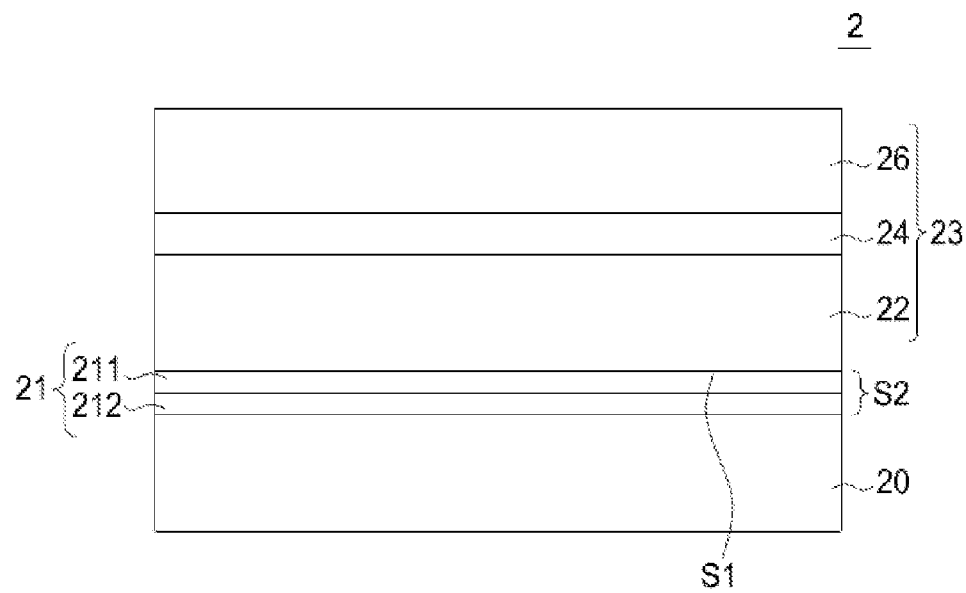
FIG. 3 shows a light-emitting device in accordance with one embodiment of the present application.

In order to make a more detailed and complete description of the present application, please refer to the following description and illustration of FIG. 3. According to a cross-sectional view of the light-emitting device 2 in accordance with an embodiment of the present application as illustrated in FIG. 3, the light-emitting device 2 comprises a transparent substrate 20, and a semiconductor light-emitting stack 23 on the transparent substrate 20, wherein the light-emitting stack 23 comprises a first semiconductor layer 22 which is close to the transparent substrate 20, a second semiconductor layer 26 which is away from the transparent substrate 20, and a light-emitting layer 24 between the first semiconductor layer 22 and the second semiconductor layer 26.

The material of the transparent substrate 20 comprises an inorganic material or a III-V group semiconductor material. The inorganic material comprises silicon carbide (SiC), germanium (Ge), sapphire, lithium aluminate (LiAlO$_2$), zinc oxide (ZnO), glass or quartz. The III-V group semiconductor material comprises indium phosphide (InP), gallium phosphide (GaP), gallium nitride (GaN), or aluminum nitride (AlN). The transparent substrate 20 can be used to carry and/or grow the semiconductor light-emitting stack 23.

The material of the semiconductor light-emitting stack 23 comprises III-V group semiconductor materials. For example, the material may comprise one or more elements selected from gallium (Ga), aluminum (Al), indium (In), phosphorus (P), nitrogen (N), zinc (Zn), cadmium (Cd), or selenium (Se). In an embodiment of the present application, the first semiconductor layer 22 has a first conductivity type, and the second semiconductor layer 26 has a second conductivity type, wherein the first conductivity type and the second conductivity type are different. For example, the first semiconductor layer 22 comprises an n-type semiconductor layer and the second semiconductor layer 26 comprises a p-type semiconductor layer. Under the drive of an external current, the electrons from the n-type semiconductor layer and the holes from the p-type semiconductor layer are combined in the light-emitting layer 24 to emit light which is extracted from the transparent substrate 20. A surface S1 of the first semiconductor layer 22 which is close to the transparent substrate 20 may be a rough surface to reduce the probability of total reflection of light on the surface S1. The method to form the rough surface is not limited. For example, etching or mechanical polishing may be used. The method to form the semiconductor light-emitting stack 23 is not limited. In addition to the method of metal organic chemical vapor deposition (MOCVD), molecular beam epitaxy (MBE), hydride vapor phase deposition (HVPE), vapor deposition method, and ion plating method may also be used.

The light-emitting device 2 of the present application is not limited to only one semiconductor light-emitting stack 23. The light-emitting device 2 may also comprise a plurality of semiconductor light-emitting stacks 23 on the transparent substrate 20, wherein a conductive line structure may be set between the plurality of semiconductor light-emitting stacks 23 to electrically connect the plurality of semiconductor light-emitting stacks 23 in series, in parallel, or both in series and parallel on the transparent substrate 20.

As illustrated in FIG. 3, in accordance with an embodiment of the present application, the light-emitting device 2 further comprises a bonding layer 21 disposed between the transparent substrates 20 and the first semiconductor layer 22. The bonding layer 21 is a multi-layer stack structure, and the number of the layers in the stack structure is not limited to two. That is, the number of the layers can be two or more than two.

According to the embodiment shown in FIG. 3, the bonding layer 21 comprises a first bonding layer 211 which is close to the first semiconductor layer 22 and a second bonding layer 212 which is away from the first semiconductor layer 22. According to one embodiment of the application, the first bonding layer 211 is adjacent to the first semiconductor layer 22. The first bonding layer 211 and the second bonding layer 212 are sequentially formed on the first semiconductor layer 22 to form the bonding layer 21. In the present embodiment, the thickness of the first bonding layer 211 or the second bonding layer 212 is less than 3 μm, and the total thickness of the bonding layer 21 is less than 4 μm. The material of the bonding layer 21 comprises oxide or metal oxide. The metal oxide comprises titanium dioxide ($TiO_2$), tantalum oxide ($Ta_2O_5$), tellurium dioxide ($TeO_2$), yttrium oxide ($Y_2O_3$), hafnium dioxide ($HfO_2$), aluminum oxide ($Al_2O_3$), indium zinc oxide (IZO), or indium tin oxide (ITO). The method to form the bonding layer 21 is not limited. In addition to spin coating, vapor deposition method can also be used.

The materials of the bonding layer 21 and the transparent substrate 20 have a transmittance of 60% or more for the light emitted by the light-emitting layer 24, preferably 70% or more, and more preferably above 80%, so that the light may be extracted from the transparent substrate 20.

According to one embodiment of the application, the first bonding layer 211 comprises a metal oxide different from a metal oxide included in the second bonding metal layer 212. For example, the first bonding material layer 211 may comprise tellurium dioxide ($TeO_2$) which has the refractive index of about 2.26, and the second bonding layer 212 may comprise hafnium dioxide ($HfO_2$) which has the refractive index of about 2.05.

According to another embodiment of the application, the first bonding layer 211 and the second bonding metal layer 212 comprise the same kind of metal oxide, wherein an oxygen content of the first bonding layer 211 is different from an oxygen content of the second bonding layer 212. For example, the first bonding layer 211 may comprise $TiO_x$, and the second bonding metal layer 212 may comprise $TiO_y$, wherein $x \neq y$, and a refractive index of $TiO_x$ is greater than the refractive index of $TiO_y$.

The first semiconductor layer 22 has a first refractive index $n_1$, the transparent substrate 20 has a second refractive index $n_2$, wherein the first refractive index $n_1$ is greater than the second refractive index $n_2$. According to one embodiment of the application, the range of the first refractive index $n_1$ of the first semiconductor layer 22 may be 3.0~3.6, the range of the second refractive index $n_2$ of the transparent substrate 20 may be 1.4~1.7, and the difference between the second refractive index $n_2$ and the first refractive index $n_1$ is greater than or equal to 1.

The bonding layer 21 is a structure having a gradually changed refractive index. The refractive index $n_{b1}$ of the first bonding layer 211 which is close to the first semiconductor layer 22 is different from the refractive index $n_{b2}$ of the second bonding layer 212 which is away from the first semiconductor layer 22. The refractive index $n_{b1}$ and the refractive index $n_{b2}$ form a continuous variation or a gradient variation. In other words, for the first semiconductor layer 22, the bonding layer 21, and the transparent substrate 20, the first refractive index $n_1$, the refractive index $n_{b1}$, the refractive index $n_{b2}$, and the second refractive index $n_2$ form a continuous variation or a gradient variation.

The refractive index $n_{b1}$ of the first bonding layer 211 is less than the first refractive index $n_1$ of the first semiconductor layer 22, and is greater than the second refractive index $n_2$ of the transparent substrate 20. Specifically, the range of the refractive index $n_{b1}$ of the first bonding layer 211 may be 2.3~2.9. The refractive index $n_{b2}$ of the second bonding layer 212 is less than the refractive index $n_{b1}$ of the first bonding layer 211, and is greater than the second refractive index $n_2$ of the transparent substrate 20. Specifically, the range of the refractive index $n_{b2}$ of the second bonding layer 212 may be 1.8~2.2.

Because the refractive index of III-V group semiconductor material is 3.0~3.6, and the refractive index of the transparent substrate 20 is 1.4~1.7, when light enters the transparent substrate 20 directly from the first semiconductor layer 22, the critical angle $\theta c$ is in the range of 22 to 35 degrees. If the incident angle is larger than this range, light is reflected to the semiconductor light-emitting stack 23 and is absorbed. In one embodiment of the present application, the bonding layer 21 having a gradually changed refractive index is formed between the transparent substrate 20 and the semiconductor light-emitting stack 23. For light proceeding from the light-emitting layer 24 toward the transparent substrate 20, the critical angle $\theta c$ is greater than 35 degrees, preferably greater than 40 degrees, more preferably greater than 50 degrees, at each interface of bonding layers, such as the first bonding layer 211 and the second bonding layer 212, and the transparent substrate 20. Change in refractive index can alter the proceeding direction of light along its proceeding path from the light-emitting layer 24 toward the transparent substrate 20, reduce the chance of total reflection, and avoid confining light to the interior of light-emitting device 2, and therefore the intensity of the light-emitting device 2 can have an increase of about 15% compared with the conventional light-emitting device 1.

Figure 4:
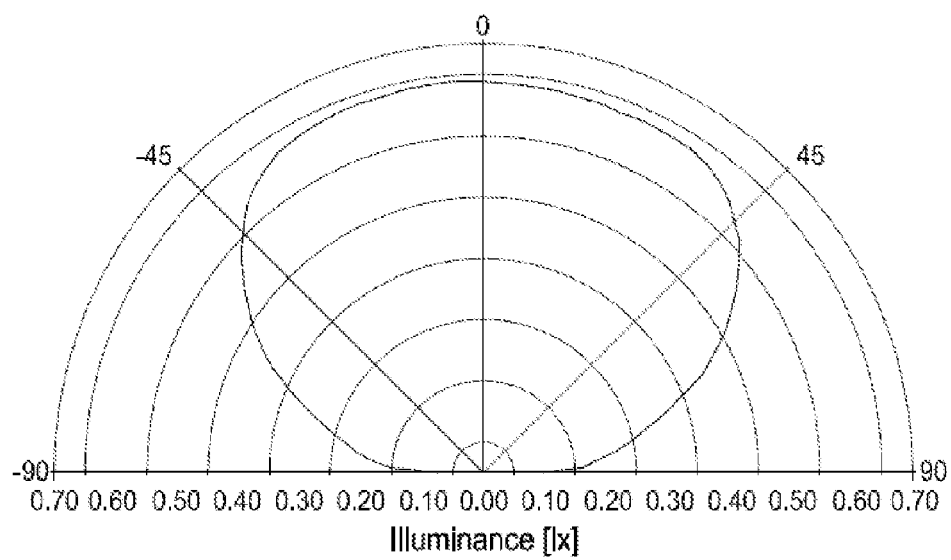
FIG. 4 shows the light intensity distribution of the light-emitting device in accordance with one embodiment of the present application.

FIG. 4 shows the light intensity distribution of the light-emitting device 2 disclosed in the embodiment of the present application. As shown in FIG. 4, light emitted by the light-emitting device 2 has a far-field angle greater than 120 degrees at 50% light intensity. In one embodiment of the present application, with the bonding layer 21 having a gradually changed refractive index formed between the transparent substrate 20 and the semiconductor light-emitting stack 23, light proceeding from the light-emitting layer 24 toward the transparent substrate 20 has a larger critical angle θc at each interface of bonding layers, such as the first bonding layer 211 and the second bonding layer 212, and the transparent substrate 20. And the reflection of light to the semiconductor light-emitting stack 23 and absorption of light by the semiconductor light-emitting stack 23 is reduced, so it is easier for light to be extracted from sidewalls S2 of the transparent substrate 20 and the bonding layer 21, and therefore the light intensity distribution of the light-emitting device 2 shows a larger far-field angle and more intense distribution in most directions compared with that of the conventional light-emitting device.

The light-emitting device in accordance with the second embodiment of the present application is illustrated as the following. The second embodiment is a modification of the above embodiment illustrated in FIG. 3. With the implement of the second embodiment, the bonding between the semiconductor light-emitting stack 23 and the transparent substrate 20 in the above embodiment in FIG. 3 is reinforced. In the present embodiment, the same material as that of the transparent substrate 20 is chosen to form the second bonding layer 212 to reinforce the bonding between the semiconductor light-emitting stack 23 and the transparent substrate 20. For example, in the present embodiment, the transparent substrate 20 is a sapphire substrate, and the material of the second bonding layer 212 is also aluminum oxide ($Al_2O_3$). As described in the first embodiment above, because the semiconductor light-emitting stack 23 comprises III-V group semiconductor material, the refractive index $n_1$ thereof is 3.0~3.6, and because the transparent substrate 20 is sapphire substrate, the second refractive index $n_2$ of the transparent substrate 20 is about 1.7. The material of the second bonding layer 212 is the same as the material of the transparent substrate 20, i.e. aluminum oxide ($Al_2O_3$) so the refractive index $n_{b2}$ of the second bonding layer 212 is substantially equal to the second refractive index $n_2$ of the transparent substrate 20 (i.e. $n_{b2}=n_2$). That is, the refractive index $n_{b2}$ of the second bonding layer 212 is also about 1.7.

As described in the first embodiment above, because the difference between the second refractive index $n_2$ of the transparent substrate 20 and the first refractive index $n_1$ of the semiconductor light-emitting stack 23 is large (the difference is also greater than or equal to 1), to reduce the chance of total reflection of light, the selection of the material of the first bonding layer 211 in this embodiment also makes the bonding layer 21 a structure that has refractive indexes gradually changed between the semiconductor light-emitting stack 23 and the transparent substrate 20. That is, the value of the refractive index $n_{b1}$ of the first bonding layer 211 is between those of the first refractive index $n_1$ of the semiconductor light-emitting stack 23 and the refractive index $n_{b2}$ of the second bonding layer 212 so that with the bonding layer 21, the semiconductor light-emitting stack 23 and the transparent substrate 20 form a continuous variation or a gradient variation in the refractive index.

Therefore, in this embodiment the first refractive index $n_1$ of the first semiconductor layer 22, the second refractive index $n_2$ of the transparent substrate 20, the refractive index $n_{b1}$ of the first bonding layer 211, and the refractive index $n_{b2}$ of the second bonding layer 212 satisfy $n_1>n_{b1}>n_{b2}=n_2$. The first bonding layer 211 can be titanium dioxide ($TiO_2$), tantalum oxide ($Ta_2O_5$), tellurium dioxide ($TeO_2$), yttrium oxide ($Y_2O_3$), hafnium dioxide ($HfO_2$), aluminum oxide ($Al_2O_3$), indium zinc oxide (IZO), indium tin oxide (ITO), or lithium niobate ($LiNbO_3$).

It is noted that when the selection of materials in this embodiment further makes the refractive index $n_{b1}$ of the first bonding layer 211, the first refractive index $n_1$ of the first semiconductor layer 22, and the second refractive index $n_2$ of the transparent substrate 20 satisfy: $(n_1*n_2)^{1/2}+0.3 \geq n_{b1} \geq (n_1*n_2)^{1/2}-0.3$, it is found that the gradually changed refractive indexes largely reduce the total reflection of light through.

Figure 5:
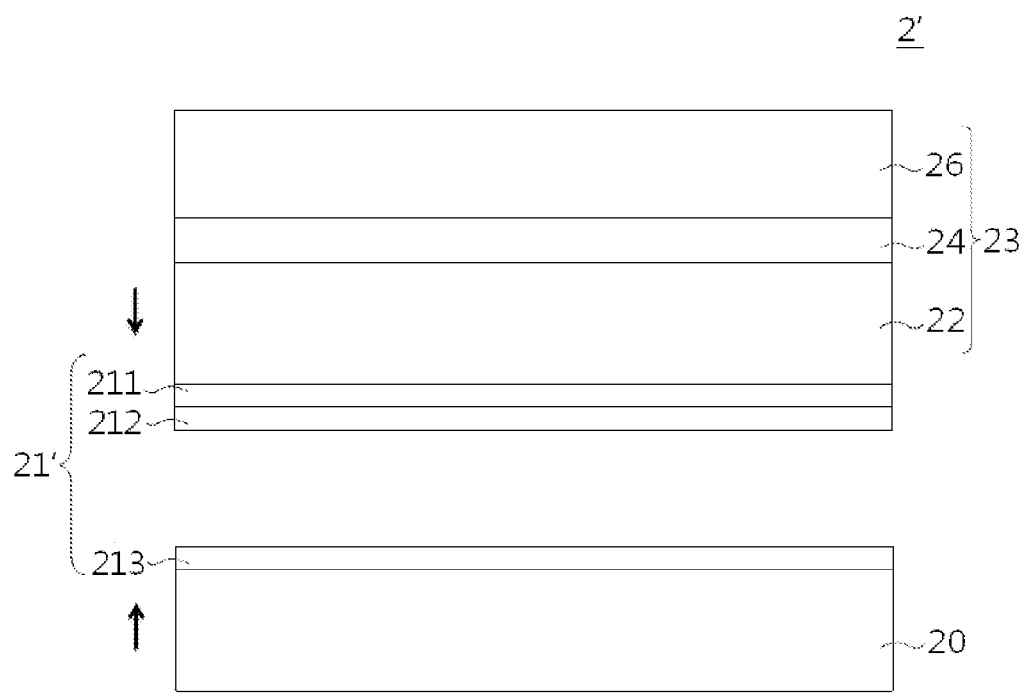
FIG. 5 shows a light-emitting device in accordance with the third embodiment of the present application.

FIG. 5 shows the light-emitting device in accordance with the third embodiment of the present application. The third embodiment is a modification of the above second embodiment. Compared with the second embodiment above, the light-emitting device 2' in the present embodiment further comprises a third bonding layer 213 disposed between the second bonding layer 212 and the transparent substrate 20. Other elements are the same as those illustrated previously in the second embodiment, and are not illustrated again. As shown in the figure, the third bonding layer 213 is formed on the transparent substrate 20, and the material of the third bonding layer 213 is the same and the material of the second bonding layer 212. For example, as described in the second embodiment above, the transparent substrate 20 comprises a sapphire substrate, and the material of the second bonding layer 212 is aluminum oxide ($Al_2O_3$). Accordingly, the same material, i.e. aluminum oxide ($Al_2O_3$), is also selected to be the third bonding layer 213 and is formed on the transparent substrate 20. And then the third bonding layer 213 and the second bonding layer 212 are bonded together. Since the third bonding layer 213 and the second bonding layer 212 comprise the same material, the bonding force between is increased. In the manufacturing process, a wafer comprising the semiconductor light-emitting stack 23 and the transparent substrate 20 can be loaded to the same machine at the same time so that the second bonding layer 212 and the third bonding layer 213 are simultaneously formed on them, respectively. In such circumstance, the thicknesses of the second bonding layer 212 and the third bonding layer 213 can be about the same. And then the third bonding layer 213 and the second bonding layer 212 are bonded together. Since both of them are formed under the same process conditions, it helps to enhance the bonding force between. After bonding, a bonding layer 21' which comprises the first bonding layer 211, the second bonding layer 212, and the third bonding layer 213 is formed between the transparent substrate 20 and the semiconductor light-emitting stack 23. As described above, the material of the second bonding layer 212 is the same as that of the transparent substrate 20, and the third bonding layer 213 and the second bonding layer 212 comprise the same material.

Based on a summation of illustration of the first to the third embodiments above, with appropriate selection of materials, persons of ordinary skill in the art are able to form a light-emitting device, wherein the light-emitting device comprises a transparent substrate; a light-emitting stack on the transparent substrate; wherein light-emitting stack comprises a first semiconductor layer which is close to the transparent substrate, a second semiconductor layer which is away from the transparent substrate, and a light-emitting layer between the first semiconductor layer and the second semiconductor layer, wherein the light-emitting layer emits light; and a bonding layer between the transparent substrate and the semiconductor light-emitting stack, wherein the bonding layer is a stack structure comprising a first bonding layer which is close to the first semiconductor layer and a second bonding layer which is away from the first semiconductor layer. And if the first semiconductor layer comprises a first refractive index $n_1$, the transparent substrate comprises a second refractive index $n_2$, the first bonding layer comprises a refractive index $n_{b1}$, and the second bonding layer comprises a refractive index $n_{b2}$, then for these refractive indices, $n_1 > n_{b1} > n_{b2} = n_2$ is satisfied. By doing so, in addition to a good bonding provided between the light-emitting stack and the transparent substrate, a continuous variation or a gradient variation in the refractive index is formed through the bonding layer. So for light emitted by the light-emitting layer and proceeding from the light-emitting layer toward the transparent substrate, the critical angle is greater than 35 degrees at each interface of bonding layers and the transparent substrate. The light extraction efficiency is enhanced. Further, when the refractive indices satisfies $(n_1 * n_2)^{1/2} + 0.3 \geq n_{b1} \geq (n_1 * n_2)^{1/2} - 0.3$, the total reflection of light is largely reduced.

The above-mentioned embodiments are only examples to illustrate the theory of the present invention and its effect, rather than be used to limit the present invention. Other alternatives and modifications may be made by a person of ordinary skill in the art of the present application without escaping the spirit and scope of the application, and are within the scope of the present application.

What is claimed is:

1. A light-emitting device comprising:
   a transparent substrate;
   a semiconductor light-emitting stack on the transparent substrate, wherein the semiconductor light-emitting stack comprises a first semiconductor layer close to the transparent substrate, a second semiconductor layer away from the transparent substrate, and a light-emitting layer capable of emitting a light disposed between the first semiconductor layer and the second semiconductor layer; and
   a bonding layer between the transparent substrate and the semiconductor light-emitting stack, wherein the bonding layer comprises a multi-layer stack structure comprising a first bonding layer close to the first semiconductor layer and a second bonding layer away from the first semiconductor layer, and wherein
   the first semiconductor layer comprises a first refractive index $n_1$, the transparent substrate comprises a second refractive index $n_2$, the first bonding layer comprises a refractive index $n_{b1}$, and the second bonding layer comprises a refractive index $n_{b2}$, and for the refractive indices, $(n_1 * n_2)^{1/2} + 0.3 \geq n_{b1} \geq (n_1 * n_2)^{1/2} - 0.3$ is satisfied.

2. The light-emitting device as claimed in claim 1, further comprising a third bonding layer between the second bonding layer and the transparent substrate.

3. The light-emitting device as claimed in claim 1, wherein the difference between the second refractive index $n_2$ and the first refractive index $n_1$ is greater than or equal to 1.

4. The light-emitting device as claimed in claim 1, wherein the refractive index $n_{b1}$ of the first bonding layer is greater than the refractive index $n_{b2}$ of the second bonding layer and is less than the first refractive index $n_1$, and the refractive index $n_{b2}$ of the second bonding layer is greater than the second refractive index $n_2$.

5. The light-emitting device as claimed in claim 1, wherein the first bonding layer and the second bonding layer comprise metal oxide.

6. The light-emitting device as claimed in claim 5, wherein the metal oxide of the first bonding layer is different from the metal oxide of the second bonding metal layer.

7. The light-emitting device as claimed in claim 5, wherein an oxygen content of the first bonding layer is different from that of the second bonding layer.

8. The light-emitting device as claimed in claim 1, wherein the first semiconductor layer has a rough surface close to the transparent substrate.

9. The light-emitting device as claimed in claim 1, comprising a plurality of semiconductor light-emitting stacks on the transparent substrate, and a conductive line structure electrically connecting the plurality of semiconductor light-emitting stacks in series, parallel, or both series and parallel on the transparent substrate.

10. The light-emitting device as claimed in claim 1, wherein $n_1 > n_{b1} > n_{b2} = n_2$ is satisfied.

11. The light-emitting device as claimed in claim 1, wherein the refractive index $n_{b2}$ of the second bonding layer is equal to the second refractive index $n_2$ of the transparent substrate.

12. The light-emitting device as claimed in claim 1, wherein the first bonding layer comprises titanium dioxide ($TiO_2$), tantalum oxide ($Ta_2O_5$), tellurium dioxide ($TeO_2$), yttrium oxide ($Y_2O_3$), hafnium dioxide ($HfO_2$), aluminum oxide ($Al_2O_3$), indium zinc oxide (IZO), indium tin oxide (ITO), or lithium niobate ($LiNbO_3$).

13. The light-emitting device as claimed in claim 1, wherein the second bonding layer comprises aluminum oxide, and the transparent substrate comprises sapphire.

14. The light-emitting device as claimed in claim 1, wherein the second bonding layer comprises titanium dioxide ($TiO_2$), tantalum oxide ($Ta_2O_5$), tellurium dioxide ($TeO_2$), yttrium oxide ($Y_2O_3$), hafnium dioxide ($HfO_2$), aluminum oxide ($Al_2O_3$), indium zinc oxide (IZO), indium tin oxide (ITO), or lithium niobate ($LiNbO_3$).

* * * * *